US012700870B2

(12) United States Patent
Hu et al.

(10) Patent No.: US 12,700,870 B2
(45) Date of Patent: Aug. 4, 2026

(54) ANALOG-TO-DIGITAL CONVERSION DEVICE

(71) Applicant: MACRONIX INTERNATIONAL CO., LTD., Hsinchu (TW)

(72) Inventors: Han-Wen Hu, Zhubei City (TW); Yung-Chun Li, New Taipei City (TW); Chih-Chang Hsieh, Hsinchu City (TW); Bo-Rong Lin, Taichung City (TW); Huai-Mu Wang, New Taipei City (TW); Chih-Huai Shih, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 148 days.

(21) Appl. No.: 18/736,681

(22) Filed: Jun. 7, 2024

(65) Prior Publication Data

US 2025/0158628 A1 May 15, 2025

Related U.S. Application Data

(60) Provisional application No. 63/548,544, filed on Nov. 14, 2023.

(51) Int. Cl.
H03M 1/10 (2006.01)
H03M 1/12 (2006.01)
(Continued)

(52) U.S. Cl.
CPC ........... H03M 1/1245 (2013.01); H03M 1/38 (2013.01); H03M 1/50 (2013.01)

(58) Field of Classification Search
CPC ........ H03M 7/165; H03M 1/361; H03M 1/36; H03M 1/1245; H03M 1/365; H03M 1/50;
(Continued)

(56) References Cited

U.S. PATENT DOCUMENTS 4,586,025 A * 4/1986 Knierim ................ H03M 7/165
341/97
6,154,157 A * 11/2000 Wong ......................... G06J 1/00
341/110

(Continued)

OTHER PUBLICATIONS

Vikas Vinayaka et al., Monolithic 8x8 SiPM with 4-bit Current-Mode Flash ADC with Tunable Dynamic Range_20190511; GLSVLSI '19, May 9-11, 2019, Tysons Corner, VA, USA.

*Primary Examiner* — Linh V Nguyen
(74) *Attorney, Agent, or Firm* — McClure, Qualey & Rodack, LLP

(57) ABSTRACT

An analog-to-digital conversion device, includes the following elements. A sensing circuit, coupled to a bit line of a memory array, and used to sense a current in the bit line to generate a bit-sequence, the bit-sequence has a form of a thermometer code to represent an analog value. A latch logic circuit, including a plurality of latches and a plurality of logic circuits to form a page buffer of the memory array, and used to generate a bit-set according to the bit-sequence, the bit-set has a form of a binary code to represent a digital value. The latches and the logic circuits are used to perform a conversion process to convert the bit-sequence into the bit-set, and the conversion process has a bit width.

14 Claims, 14 Drawing Sheets

(51) Int. Cl.
H03M 1/38 (2006.01)
H03M 1/50 (2006.01)

(58) Field of Classification Search
CPC ...... H03M 1/56; H03M 1/0809; H03M 1/123;
H03M 1/14; H03M 1/202; H03M 1/34;
H03M 1/38; H03M 1/46; H03M 1/502;
H03M 1/687; H03M 1/745; H03M 1/747;
H03M 7/04; H03M 1/00; H03M 1/001;
H03M 1/002; H03M 1/007; H03M
1/0604; H03M 1/0612; H03M 1/0629;
H03M 1/0682; H03M 1/0872; H03M
1/1009; H03M 1/1028; H03M 1/1057;
H03M 1/1071; H03M 1/12; H03M
1/1205; H03M 1/121; H03M 1/1215;
H03M 1/1225; H03M 1/1295; H03M
1/144; H03M 1/145; H03M 1/146; H03M
1/165; H03M 1/18; H03M 1/504; H03M
1/682; H03M 1/685; H03M 1/76; H03M
1/78; H03M 1/82; H03M 13/09; H03M
13/611; H03M 3/34; H03M 3/422; H03M
5/08; H03M 7/00; H03M 7/16
USPC .................................. 341/142, 155, 160, 164
See application file for complete search history.

(56) References Cited

U.S. PATENT DOCUMENTS

| | | | | |
|---|---|---|---|---|
| 6,169,503 | B1 * | 1/2001 | Wong | H03M 1/76 |
| | | | | 341/136 |
| 6,232,908 | B1 | 5/2001 | Nakaigawa | |
| 6,346,906 | B1 * | 2/2002 | Nakaigawa | H03M 7/165 |
| | | | | 341/64 |
| 6,433,725 | B1 * | 8/2002 | Chen | H03M 7/165 |
| | | | | 341/160 |
| 6,816,100 | B1 * | 11/2004 | Galton | H03M 1/0682 |
| | | | | 341/143 |
| 7,098,839 | B2 * | 8/2006 | Pickerd | G11C 27/00 |
| | | | | 341/158 |
| 7,541,961 | B1 * | 6/2009 | Garg | H03M 1/1225 |
| | | | | 341/158 |
| 2006/0227027 | A1 | 10/2006 | Doerrer | |
| 2014/0232827 | A1 * | 8/2014 | Kumar | G01S 17/894 |
| | | | | 348/46 |
| 2022/0336004 | A1 * | 10/2022 | Yoon | G11C 29/023 |
| 2023/0186983 | A1 * | 6/2023 | Grover | G11C 11/418 |
| | | | | 365/156 |
| 2023/0386564 | A1 * | 11/2023 | Dhori | G11C 7/1006 |
| 2024/0212765 | A1 * | 6/2024 | Chen | G11C 29/20 |
| 2025/0167805 | A1 * | 5/2025 | Kim | G11C 29/848 |

* cited by examiner

| MSB1:Q2 | MSB2:Q1 | LSB1: | LSB2:L2 | LSB3:CDL |
|---------|---------|-------|---------|----------|
|  |  | Q1=1  4Q | 4Q | 4Q |
|  | 3.5Q |  |  |  |
|  | Q2=1 Q1=0  3Q | | 3Q | 3Q |
| 2.5Q |  |  |  |  |
|  | Q2=0 Q1=1  2Q | | 2Q | 2Q |
|  | 1.5Q |  |  |  |
|  | Q1=0  1Q | | 1Q | 1Q |

$V_{SEN}$

Toggle $\Delta(V_{Boost})\_0$ $\Delta(V_{Boost})\_1$ $\Delta(V_{Boost})\_2$ strobes $V_{Boost}$ $\Delta(V_{Boost})\_0$ $\Delta(V_{Boost})\_1$ $\Delta(V_{Boost})\_2$ $V_{SEN}$ $V_{SEN} - \Delta(V_{Boost})\_2 > SA\_V_{TH}$   $V_{SEN}$~

$\Delta(V_{Boost})\_1 > SA\_V_{TH}$   $V_{SEN}$~

$\Delta(V_{Boost})\_0 > SA\_V_{TH}$ t01   t0   t1   t2   t

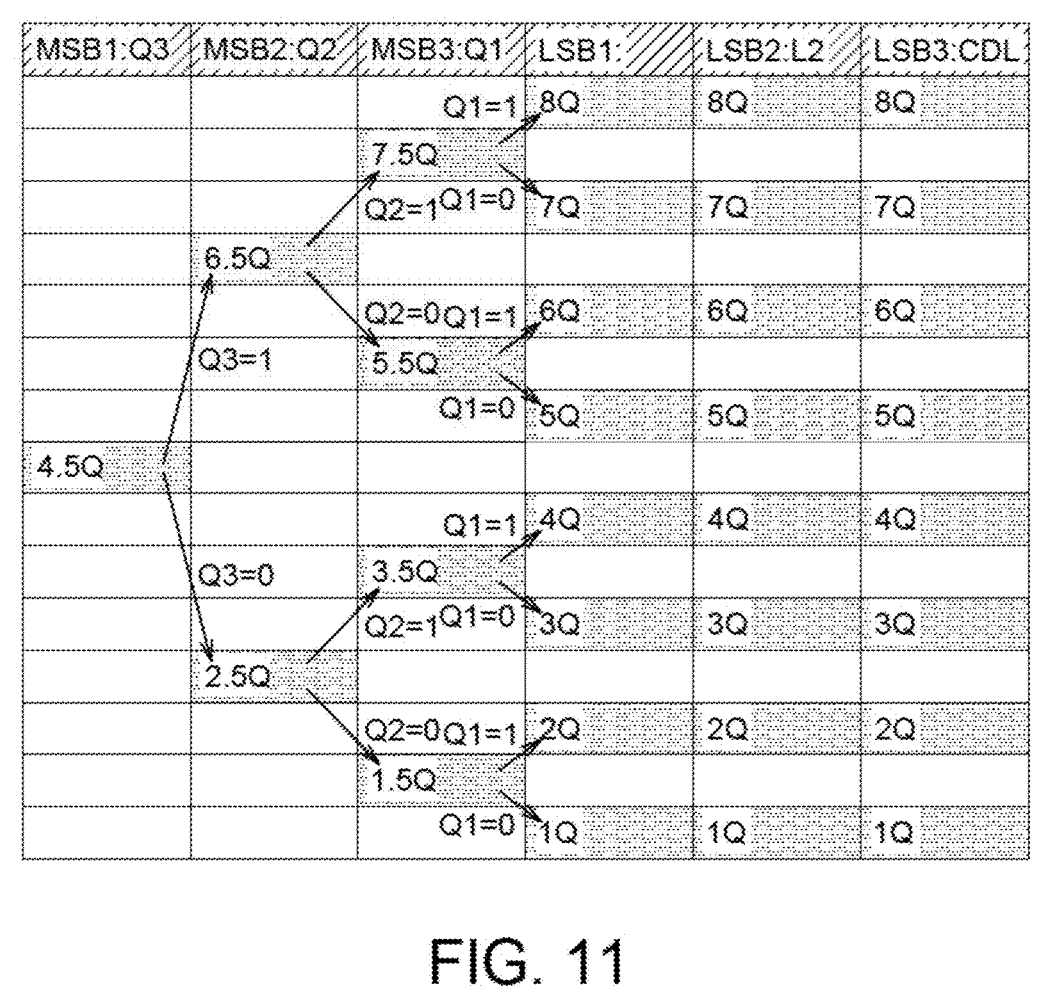

| MSB1:Q3 | MSB2:Q2 | MSB3:Q1 | LSB1: | LSB2:L2 | LSB3:CDL |
|---------|---------|---------|-------|---------|----------|
|         |         | Q1=1 8Q | | 8Q | 8Q |
|         | 7.5Q    |         | | | |
|         |         | Q2=1 Q1=0 7Q | | 7Q | 7Q |
|         | 6.5Q    |         | | | |
|         |         | Q2=0 Q1=1 6Q | | 6Q | 6Q |
|         | Q3=1    | 5.5Q    | | | |
|         |         | Q1=0 5Q | | 5Q | 5Q |
| 4.5Q    |         |         | | | |
|         |         | Q1=1 4Q | | 4Q | 4Q |
|         | Q3=0    | 3.5Q    | | | |
|         |         | Q2=1 Q1=0 3Q | | 3Q | 3Q |
|         |         | 2.5Q    | | | |
|         |         | Q2=0 Q1=1 2Q | | 2Q | 2Q |
|         |         | 1.5Q    | | | |
|         |         | Q1=0 1Q | | 1Q | 1Q |

FIG. 11

ANALOG-TO-DIGITAL CONVERSION DEVICE

This application claims the benefit of U.S. provisional application Ser. No. 63/548,544, filed Nov. 14, 2023, the disclosure of which is incorporated by reference herein in its entirety.

TECHNICAL FIELD

The present disclosure relates to an electronic device, and in particular, relates to an analog-to-digital conversion device.

BACKGROUND

With the evolution of semiconductor technology, a memory array has an ability to perform in-memory computing (IMC) or in-memory searching (IMS). The results of in-memory computing and in-memory searching often require analog-to-digital conversion to obtain digital values. Furthermore, an analog-to-digital conversion device is relied upon to perform the analog-to-digital conversion.

Analog-to-digital conversion devices include several types which are commonly used: a flash analog-to-digital converter (flash ADC), a time-to-digital conversion (TDC) type of ADC, or a successive-approximation register (SAR) type of ADC. However, the above-mentioned analog-to-digital conversion devices have disadvantages in operation. For example, the flash ADC performs parallel input, hence it has a greater hardware circuit area. Moreover, when the TDC performs a conversion of the thermometer code and the binary code, it performs logical operations based on the flip-flop (DFF), hence its hardware circuit area is also great, and its operating time is long. In addition, the SAR type ADC must perform complex output storage and must additionally generate a reference voltage.

In view of the above issues, it is desirable to have an improved analog-to-digital conversion device which may achieve a smaller hardware circuit area and a shorter operating time, and may be adapted to a standard page buffer architecture of the memory array.

SUMMARY

According to an embodiment of the present disclosure, an analog-to-digital conversion device is provided. The analog-to-digital conversion device includes the following elements. A sensing circuit, coupled to a bit line of a memory array, and used to sense a current in the bit line to generate a bit-sequence, the bit-sequence has a form of a thermometer code to represent an analog value. A latch logic circuit, including a plurality of latches and a plurality of logic circuits to form a page buffer of the memory array, and used to generate a bit-set according to the bit-sequence, the bit-set has a form of a binary code to represent a digital value. The latches and the logic circuits are used to perform a conversion process to convert the bit-sequence into the bit-set, and the conversion process has a bit width.

BRIEF DESCRIPTION OF THE DRAWINGS

FIG. 3A-1 is a schematic diagram illustrating the change of the voltage $V_{SEN}$ of the node SEN of the sensing circuit 100 with respect to time t.

FIG. 3A-2 is a schematic diagram illustrating the changes of the voltage $V_{SEN}$ of the node SEN and the voltage $V_{Boost}$ of the node Boost.

FIG. 3B-1 is a schematic diagram illustrating the change of the voltage $V_{SEN}$ of the node SEN with respect to time t when the analog-to-digital conversion device 1000 performs analog-to-digital conversion of two bits.

FIG. 3B-2 is a schematic diagram illustrating the changes of the voltage $V_{SEN}$ of the node SEN and the voltage $V_{Boost}$ of the node Boost when the analog-to-digital conversion device 1000 performs analog-to-digital conversion of two bits.

FIG. 11 illustrates an adjustment method of the initial charge amount $Q_{SEN}$ of the node SEN when the latch logic circuit 200 of this embodiment processes the bits $O_0\sim O_{14}$ to generate the bits $B_0\sim B_3$.

Figure 1:
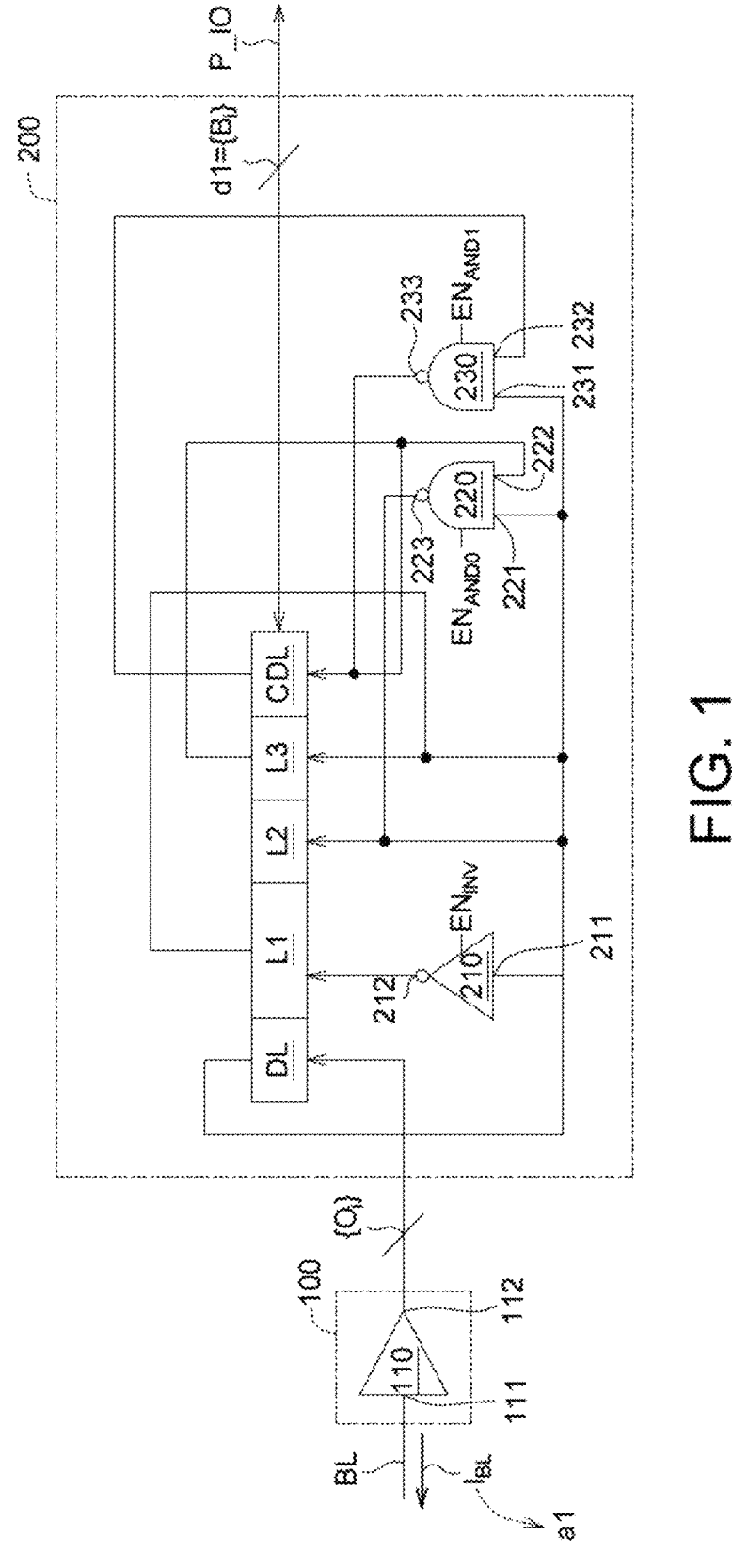
FIG. 1 is a circuit diagram of an analog-to-digital conversion device 1000 according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a circuit diagram of an analog-to-digital conversion device 1000 according to an embodiment of the present disclosure. As shown in FIG. 1, the analog-to-digital conversion device 1000 is coupled to one bit line BL of the bit lines of the memory array (the memory array is not shown in FIG. 1). The memory array is, for example, an array of NAND flash or an array of NOR flash, etc. In the memory array, a memory string corresponding to the bit line BL performs in-memory computing (IMC) or in-memory searching (IMS), and the bit line BL generates a current $I_{BL}$ to represent an operation result or a searching result. The current $I_{BL}$ has an analog value a1.

The analog-to-digital conversion device 1000 includes a sensing circuit 100 and a latch logic circuit 200. The sensing circuit 100 is coupled to the bit line BL, and the sensing circuit 100 senses the current $I_{BL}$ and generates a sensing result. The sensing result may be represented as a bit-sequence {Oi} to reflect the analog value a1 of the current $I_{BL}$. The bit-sequence {Oi} includes several bits $O_0$, $O_1$, $O_2$, etc.

The analog-to-digital conversion device 1000 is used to perform analog-to-digital conversion to convert the analog value a1 of the current $I_{BL}$ into a digital value d1. The digital value d1 may be represented as a bit-set {Bi}. The bit-set {Bi} includes several bits $B_1$, $B_2$, etc. The analog-to-digital conversion device 1000 of this embodiment performs analog-to-digital conversion of two bits (i.e., the bit width is equal to "two") according to a mechanism of time-to-digital conversion (TDC), and the generated digital value d1 includes two bits $B_1$ and $B_0$.

The sensing circuit 100 includes a sensing amplifier (SA) 110. The input end 111 of the sensing amplifier 110 is coupled to the bit line BL. The output end 112 of the sensing amplifier 110 is coupled to the latch logic circuit 200. The latch logic circuit 200 is coupled to the output end 112 of the sensing amplifier 110. The latch logic circuit 200 is used to process the sensing result generated by the sensing circuit 100, so as to convert the analog value a1 represented by the bit-sequence {Oi} into the digital value d1 represented by the bit-set {Bi}. Furthermore, the latch logic circuit 200 transmits the generated digital value d1 to an external circuit through a data input/output path P_IO (the external circuit is not shown in FIG. 1). In one example, the external circuit is an accumulator, and the data input/output path P_IO is disposed corresponding to the bit line BL.

More specifically, the latch logic circuit 200 has a circuit architecture of a "page buffer". The page buffer is adapted to the architecture and operations of the memory array. The latch logic circuit 200 includes a latch DL, latches L1~L3 and a latch CDL for performing latch function. Furthermore, the latch logic circuit 200 includes several logic circuits to perform logic operations, such as an inverter 210, a NAND gate 220 and a NAND gate 230. The latch DL is coupled to the output end 112 of the sensing amplifier 110 to receive and store the bit-sequence {Oi} generated by the sense circuit 100. The latch CDL outputs the bit-set {Bi} through the data input and output path P_IO.

In this embodiment, the input end 211 of the inverter 210, the input end 221 of the NAND gate 220 and the input end 231 of the NAND gate 230 are jointly coupled to the latch DL, the latch L2 and the latch. The other input end 222 of the NAND gate 220 is coupled to the latch L3, and the other input end 232 of the NAND gate 230 is coupled to the latch CDL. Furthermore, the output end 212 of the inverter 210 is coupled to the latch L1, and the output end 223 of the NAND gate 220 and the output end 233 of the NAND gate 230 are jointly coupled to the latch CDL. Furthermore, the inverter 210, the NAND gate 220 and the NAND gate 230 respectively receive an enable signal $EN_{INV}$, an enable signal $EN_{AND0}$ and an enable signal $EN_{AND1}$.

Figure 2:
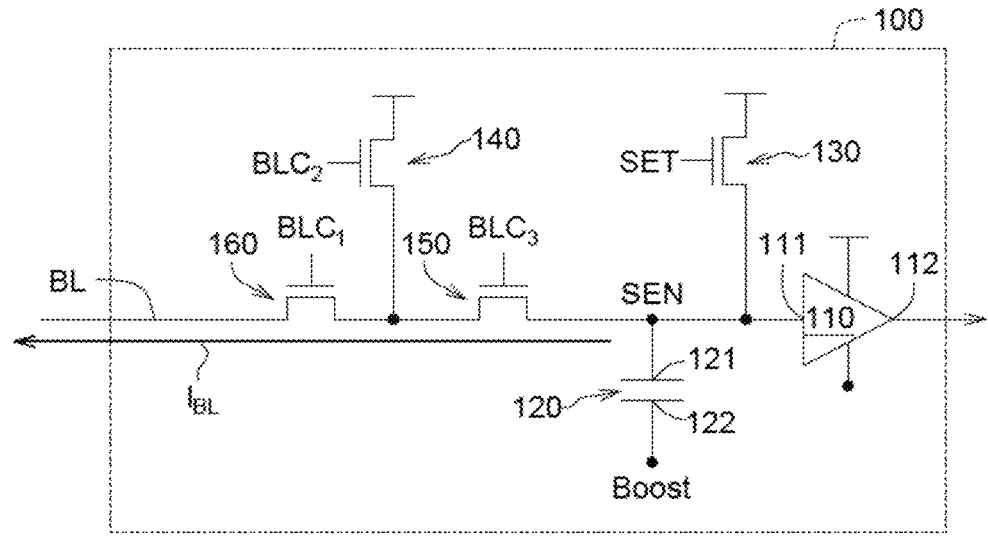
FIG. 2 is a circuit diagram of the sensing circuit 100 in FIG. 1.

FIG. 2 is a circuit diagram of the sensing circuit 100 in FIG. 1. As shown in FIG. 2, the sensing circuit 100 includes a sensing amplifier 110, four transistors 130, 140, 150 and 160, and a capacitor 120. The current $I_{BL}$ of bit line BL flows through transistors 150 and 160. The transistor 160 is coupled to the transistor 150 in series, and the transistor 150 is connected to the input end 111 of the sensing amplifier 110. One end of the transistor 140 is coupled between the transistors 150 and 160. Transistor 130 has a gate voltage SET, transistor 140 has a gate voltage $BLC_2$, transistor 150 has a gate voltage $BLC_3$, and transistor 160 has a gate voltage $BLC_1$.

One end 121 of the capacitor 120, one end of the transistor 130 and the input end 111 of the sensing amplifier 110 are jointly coupled to a node SEN. The node SEN has a voltage $V_{SEN}$. The voltage $V_{SEN}$ may be referred to as the "first node voltage". The other end 122 of the capacitor 120 is coupled to a node Boost. The node Boost has a voltage $V_{Boost}$. The voltage $V_{Boost}$ may be referred to as the "second node voltage".

The sensing circuit 100 may set the voltage $V_{SEN}$ of the node SEN as an initial voltage $V_{SEN01}$. Furthermore, the sensing circuit 100 may set the node SEN to have an initial charge amount $Q_{SEN}$. The initial charge amount $Q_{SEN}$ is equal to the initial voltage $V_{SEN01}$ multiplied by an equivalent capacitance $C_{SEN}$ of the node SEN, as shown in equation (1-1).

$$Q_{SEN} = V_{SEN01} \times C_{SEN} \qquad (1-1)$$

Figures 1, 3A:
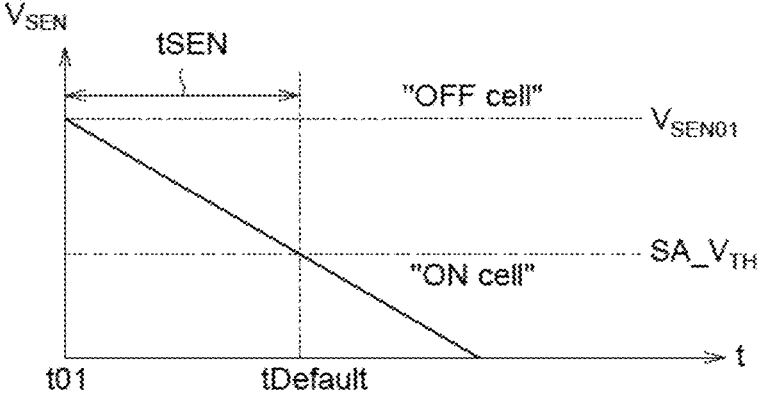
Figures 2, 3A:
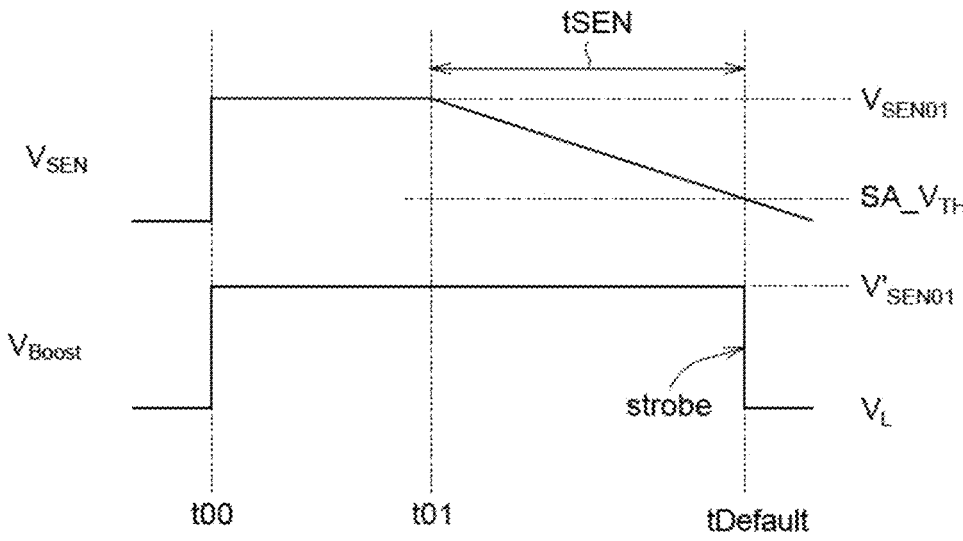

FIG. 3A-1 is a schematic diagram illustrating the change of the voltage $V_{SEN}$ of the node SEN of the sensing circuit 100 with respect to time t. Please refer to both FIGS. 2 and 3A-1. If the sensing circuit 100 is in a turned-off state (referred to as an "OFF cell"), the sensing circuit 100 does not allow any current to flow, hence the node SEN will not discharge, and the voltage $V_{SEN}$ of the node SEN remains as Initial voltage $V_{SEN01}$. On the contrary, if the sensing amplifier 110 is in a turned-on state (referred to as an "ON cell"), the current $I_{BL}$ of the bit line BL may flow through the sense circuit 100, and the node SEN may be discharged by the current $I_{BL}$, causing the voltage $V_{SEN}$ of the node SEN to decrease.

The sensing amplifier 110 has a threshold voltage $SA\_V_{TH}$. The sensing amplifier 110 may include a differential amplifier, inside the sensing amplifier 110 (the differential amplifier is not shown in FIG. 2). The threshold voltage $SA\_V_{TH}$ of the sensing amplifier 110 is, for example, a reference voltage of one input end of the differential amplifier. In the turned-on state "ON cell" of the sensing amplifier 110, the voltage $V_{SEN}$ of the node SEN continues to decrease with time t, and the voltage $V_{SEN}$ of the node SEN decreases to the threshold voltage $SA\_V_{TH}$ at time point tDefault The period tSEN from time point t01 to time point tDefault may be referred to as an "execution period".

FIG. 3A-2 is a schematic diagram illustrating the changes of the voltage $V_{SEN}$ of the node SEN and the voltage $V_{Boost}$ of the node Boost. Please refer to both FIGS. 2 and 3A-2, In an initial stage of operation of the sensing circuit 100, the sensing circuit 100 charges the node SEN, so that the voltage $V_{SEN}$ of the node SEN increases to the initial voltage $V_{SEN01}$ at time point t00. Through the coupling effect of the capacitor 120, the voltage $V_{Boost}$ of the node Boost also increases to the initial voltage $V'_{SEN01}$ at the time point t00.

Then, the node SEN is discharged by the current $I_{BL}$ of the bit line BL, and the voltage $V_{SEN}$ of the node SEN starts to decrease from the time point t01, and decreases to the threshold voltage $SA\_V_{TH}$ of the sensing amplifier 110 at the time point tDefault. During the execution period tSEN between time point t01 and time point tDefault, the operation of the sensing circuit 100 may be referred to as "bit line toggling (BL toggling)".

The voltage $V_{Boost}$ of the node Boost decreases to a low voltage $V_L$ at time point tDefault. Through the coupling effect of the capacitor 120, the voltage $V_{SEN}$ of the node SEN also further decreases. The operation in which the voltage $V_{Boost}$ decreases to the low voltage $V_L$ at the time point tDefault may be referred to as a "strobe" of the sensing amplifier 110.

When the sensing amplifier 110 performs the strobe at time point tDefault, the sensing amplifier 110 generates a corresponding bit $O_i$ according to the relationship between the voltage $V_{SEN}$ and the threshold voltage $SA\_V_{TH}$. If the voltage of node SEN at time point tDefault is greater than the threshold voltage $SA\_V_{TH}$ (as shown in equation (1-2)), the bit $O_i$ generated by the sensing amplifier 110 is a logic value "0". In which, the current $I_{BL}$ multiplied by execution time tSEN is equal to a charge amount difference $\Delta Q$ which is discharged by node SEN. The charge amount difference $\Delta Q$ divided by the equivalent capacitance $C_{SEN}$ of the node SEN is equal to a voltage difference $\Delta V$ which is discharged by the node SEN. The initial voltage $V_{SEN01}$ minus the voltage difference $\Delta V$ is equal to the voltage of node SEN at time point tDefault.

$$SA\_V_{TH} < V_{SEN01} - (I_{BL} \times tSEN)/C_{SEN} \qquad (1\text{-}2)$$

On the contrary, if the voltage of node SEN at time point tDefault is less than the threshold voltage $SA\_V_{TH}$ (as shown in equation (1-3)), then the bit $O_i$ generated by the sensing amplifier 110 is a logic value "1".

$$SA\_V_{TH} > V_{SEN01} - (I_{BL} \times tSEN)/C_{SEN} \qquad (1\text{-}3)$$

Figures 1, 3B:
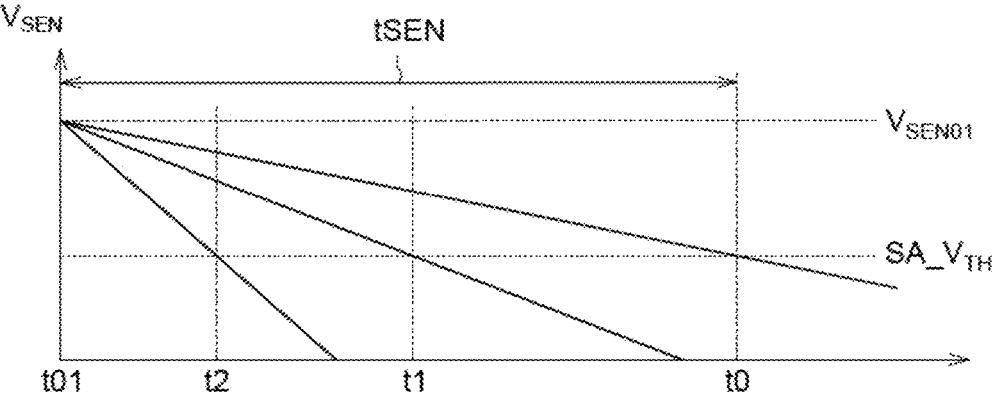
Figures 2, 3B:
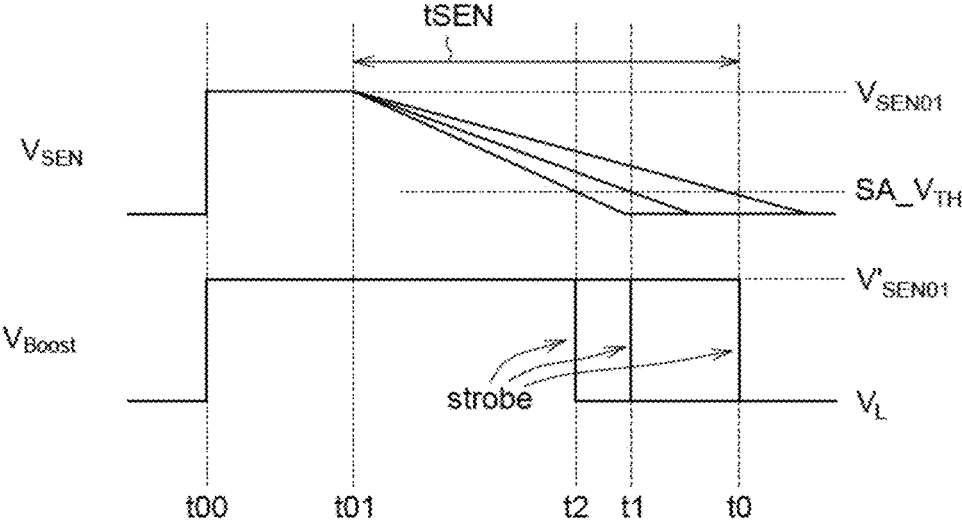

FIG. 3B-1 is a schematic diagram illustrating the change of the voltage $V_{SEN}$ of the node SEN with respect to time t when the analog-to-digital conversion device 1000 performs analog-to-digital conversion of two bits. FIG. 3B-2 is a schematic diagram illustrating the changes of the voltage $V_{SEN}$ of the node SEN and the voltage $V_{Boost}$ of the node Boost when the analog-to-digital conversion device 1000 performs analog-to-digital conversion of two bits. Please refer to both FIGS. 2, 3B-1 and 3B-2, in order to perform analog-to-digital conversion of two bits, the sensing circuit 100 sets three time points t2, t1 and t0 to perform sequential input quantization, and the time points t2, t1 and t0 may be referred to as "sensing time points". The sensing circuit 100 performs strobe operations at time points t2, t1 and t0 to generate three bits $O_2$, $O_1$ and $O_0$ respectively. The sensing circuit 100 performs bit line recovery operation on the bit line BL at time points t2, t1 and t0 respectively.

For example, the sensing circuit 100 discharges the node SEN by the current $I_{BL}$ of the bit line BL, so that the voltage $V_{SEN}$ starts to decrease from the time point t01, and decreases to the threshold voltage $SA\_V_{TH}$ of the sensing amplifier 110 at the time point t2, and performs a strobe operation at the time point t2 to generate bit $O_2$. At time point t2, the charge amount difference $\Delta Q$ which is discharged by node SEN, is equal to the current $I_{BL}$ multiplied by a time difference between time point t2 and time point t01. Similarly, the sensing circuit 100 performs a strobe operation at time point t1 to generate bit $O_1$. At time point t1, the charge amount difference $\Delta Q$ which is discharged by node SEN, is equal to the current $I_{BL}$ multiplied by the time difference between time point t1 and time point t01. Furthermore, the sensing circuit 100 performs a strobe operation at time point t0 to generate bit $O_0$. The charge amount difference $\Delta Q$ which is discharged by node SEN at time point t0, is equal to the current $I_{BL}$ multiplied by the time difference between time point t0 and time point t01.

The three bits $O_2$, $O_1$ and $O_0$ generated by the sensing circuit 100 at time points t2, t1 and t0 have a form of a thermometer code. The several latches and several logic circuits of the latch logic circuit 200 are used to perform conversion process to convert the bits $O_2$, $O_1$ and $O_0$ of the thermometer code into two bits $B_1$ and $B_0$ of the binary code, so as to form the digital value d1. That is, the latch logic circuit 200 performs a conversion process to convert the bit-sequence $\{O_i\}$ of the thermometer code into the bit-set $\{Bi\}$ of the binary code. The bit width of the conversion process performed by the latch logic circuit 200 is equal to the bit width of the analog-to-digital conversion performed by the analog-to-digital conversion device 1000. The bit width of this embodiment is equal to "two".

TABLE 1-1

| thermometer code | | | Binary code | | Decimal |
|---|---|---|---|---|---|
| $O_2$ | $O_1$ | $O_0$ | $B_1$ | $B_0$ | value |
| 0 | 0 | 0 | 0 | 0 | 0 |
| 0 | 0 | 1 | 0 | 1 | 1 |
| 0 | 1 | 1 | 1 | 0 | 2 |
| 1 | 1 | 1 | 1 | 1 | 3 |

Table 1-1 is a truth table for the conversion of the bits $O_2$, $O_1$ and $O_0$ of the thermometer code into the bits $B_1$ and $B_0$ of the binary code. For example, when bits $O_2$, $O_1$ and $O_0$ are "0,0,0", they are converted into bits $B_1$ and $B_0$ as "0,0". When bits $O_2$, $O_1$ and $O_0$ are "0,0,1", they are converted into bits $B_1$ and $B_0$ as "0, 1", etc. According to Table 1-1, a "true value conversion" of bits $O_2$, $O_1$ and $O_0$ and bits $B_1$ and $B_0$ may be obtained, such as equation (2-1) and equation (2-2).

$$B_1 = O_1 \qquad (2\text{-}1)$$

$$B_0 = \overline{O_0 \, \&\overline{O_1} \, \&O_1 \, \&O_2} \qquad (2\text{-}2)$$

Please refer to FIG. 1 again, the inverter 210, NAND gate 220 and NAND gate 230 of the latch logic circuit 200 are used to perform the true value conversion between the thermometer code and the binary code in Table 1-1. More specifically, the inverter 210, the NAND gate 220 and the NAND gate 230 are respectively enabled to perform logical operations in different operating cycles according to the enable signals $EN_{INV}$, $EN_{AND0}$ and $EN_{AND1}$, and cooperate with latches DL, L1, L2, L3 and CDL to convert the bits $O_2$, $O_1$ and $O_0$ of the thermometer code into the bits $B_1$ and $B_0$ of the binary code according to equations (2-1) and (2-2). Please refer to Table 1-2 and Table 1-3 for the logic operations of the latch logic circuit 200. Firstly, in the operating period "Cycle 1", the following operations are performed: (1) The bit $O_2$ obtained at time point t2 is stored in the latch DL. (2) The bit $O_2$ stored in the latch DL is transferred to the latch L3.

Then, in the next operating period "Cycle 2", the following operations are performed: (1) The bit $O_1$ obtained at time point t1 is stored in the latch DL. (2) The bit $O_1$ stored in the latch DL and the bit $O_2$ stored in the latch L3 are performed with an "NAND" operation by the NAND gate 220 to obtain $\overline{O_2\&O_1}$. And, the operation result $\overline{O_2\&O_1}$ is stored in the latch L3. (3) The inverter 210 inverts the bit $O_1$ stored in the latch DL to $\overline{O_1}$ and stores it in the latch L1. (4) The bit $O_1$ stored in the latch DL is transferred to the latch L2. (5) The $\overline{O_2\&O_1}$ stored in latch L3 is transferred to latch CDL.

Then, in the next operating cycle "Cycle 3", the following operations are performed: (1) The bit $O_1$ stored in the latch DL is transferred to the latch L3. (2) The bit $O_0$ obtained at time point t1 is stored in the latch DL. (3) The bit $O_0$ stored in the latch DL and the bit $01$ stored in the latch L3 perform an "NAND" operation through the NAND gate 220 to obtain $\overline{O_1\&O_0}$, and the operation result $\overline{O_1\&O_0}$ is stored in latch L3. (4) The $\overline{O_1\&O_0}$ stored in the latch CDL and the $\overline{O_1\&O_0}$ stored in the latch L3 perform an "NAND" operation through the NAND gate 230 to obtain $\overline{O_0\&\overline{O_1}\&O_1\&O_2}$ and stored to latch CDL.

TABLE 1-2

| Cycle | DL | L1 | L2 | L3 | CDL |
|---|---|---|---|---|---|
| 1 | $O_2$ | | | $O_2$ | |
| 2 | $O_2 \to O_1$ | $\overline{O_1}$ | $O_1$ | $O_2 \to$ $\overline{O_2\&O_1}$ | $\overline{O_2\&O_1}$ |
| 3 | $O_1 \to O_0$ | $\overline{O_1}$ | $O_1$ | $\overline{O_2\&O_1} \to$ $\overline{O_1} \to$ $\overline{O_0\&\overline{O_1}}$ | $\overline{O_2\&O_1} \to$ $\overline{O_0\&\overline{O_1}\&O_1\&O_2}$ |

TABLE 1-3

| Cycle | | | | |
|---|---|---|---|---|
| 1 | L3 = DL | | | |
| 2 | L3 = (L3)NAND(DL) | CDL= L3 | L1 = INV(DL) | L2 = DL |
| 3 | L3 = DL | L3 = (L3)NAND(DL) | CDL = (CDL)NAND(L3) | |

Figure 4:
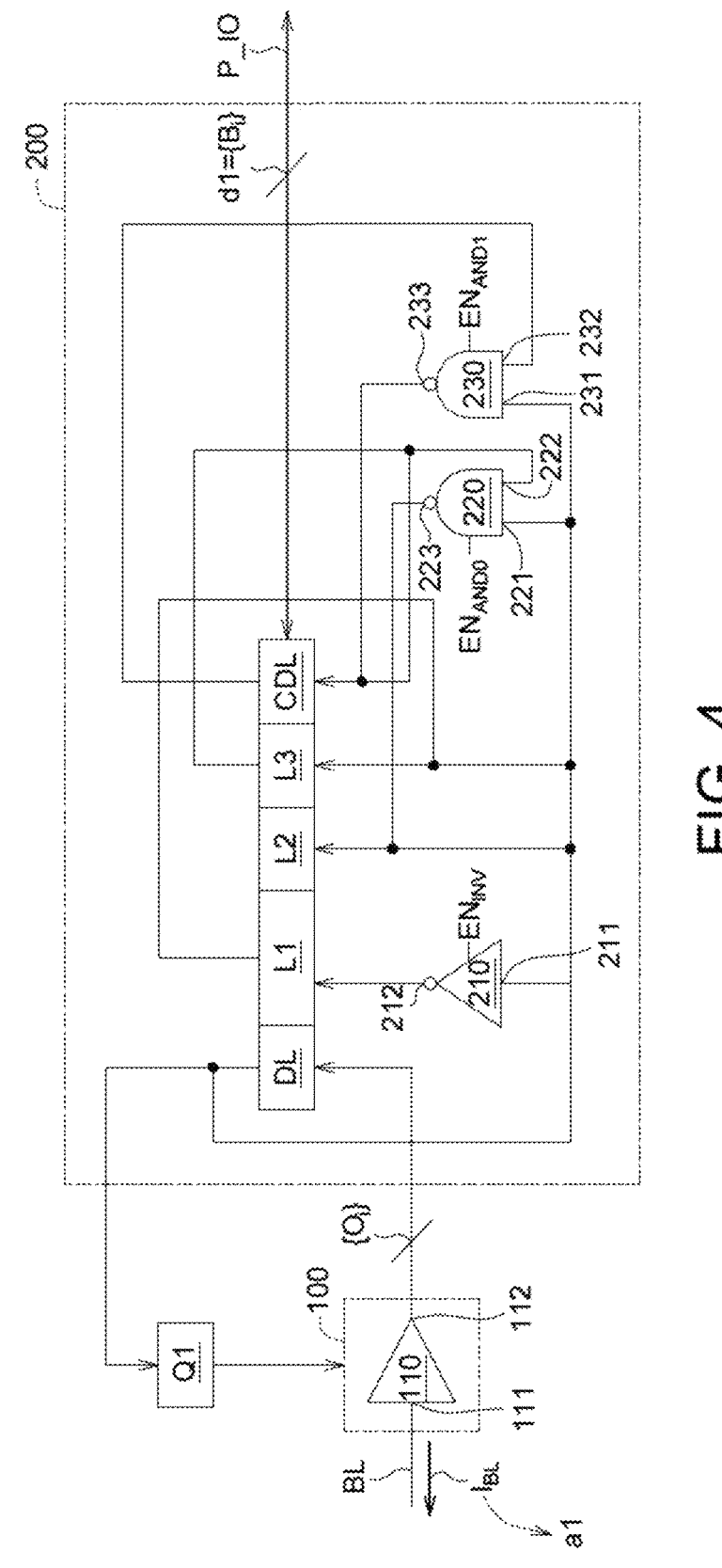
FIG. 4 is a circuit diagram of an analog-to-digital conversion device 1001 according to another embodiment of the present disclosure.

FIG. 4 is a circuit diagram of an analog-to-digital conversion device 1001 according to another embodiment of the present disclosure. The analog-to-digital conversion device 1001 of this embodiment is used to perform analog-to-digital conversion of three bits (i.e., the bit width is equal to "three"). The generated digital value d1 may include three bits $B_2$, $B_1$, and $B_0$. Compared with the analog-to-digital conversion device 1000 in FIG. 1, the analog-to-digital conversion device 1001 of this embodiment further includes a latch element Q1. The latch element Q1 is coupled to the latch DL of the latch logic circuit 200 and the sensing circuit 100. The latch element Q1 is used to set the initial charge amount $Q_{SEN}$ of the node SEN of the sensing circuit 100.

Figure 5:
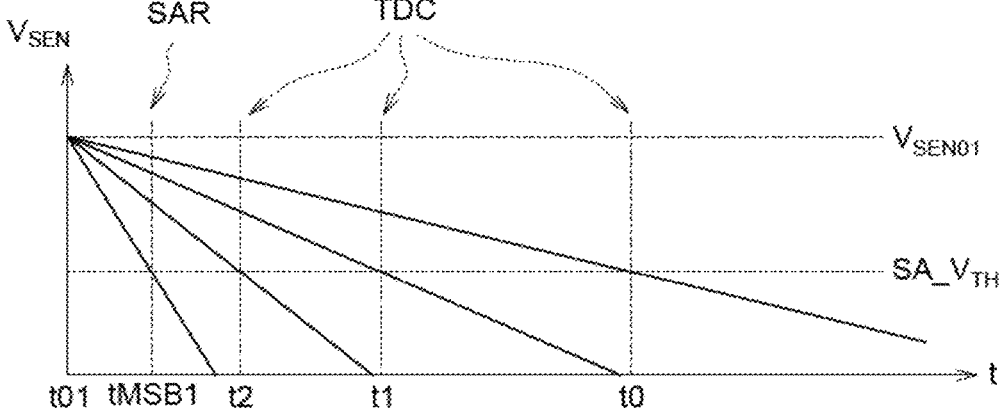
FIG. 5 is a schematic diagram illustrating the change of the voltage $V_{SEN}$ of the node SEN with respect to time t when the analog-to-digital conversion device 1001 of FIG. 4 performs analog-to-digital conversion of three bits.

FIG. 5 is a schematic diagram illustrating the change of the voltage $V_{SEN}$ of the node SEN with respect to time t when the analog-to-digital conversion device 1001 of FIG. 4 performs analog-to-digital conversion of three bits. Please refer to both FIGS. 4 and 5, the sensing circuit 100 of this embodiment sets four time points tMSB1, t2, t1 and t0 to perform sequence input quantization. More specifically, according to the mechanism of the successive-approximation register (SAR), the analog-to-digital conversion device 1001 generates bit $B_2$ of the most significant bit (MSB) at the time point MSB1. After sensing at time point tMSB1, the sensing circuit 100 sets the initial charge amount $Q_{SEN}$ of the node SEN as an equivalent charge amount Q or an equivalent charge amount 2 Q, through the latch element Q1. In an example, the equivalent capacitance $C_{SEN}$ of the node SEN may be set as 2 times, or the voltage difference $\Delta V$ with which the node SEN is discharged may be set as 2 times. Alternatively, the equivalent capacitance $C_{SEN}$ may be set as 1.4 times, or the voltage difference $\Delta V$ for discharging may be set as 1.4 times.

Then, according to the mechanism of TDC, the analog-to-digital conversion device 1001 generates the two bits $B_1$ and $B_0$ of the least significant bits (LSB) at time points t2, t1, and t0.

TABLE 2-1

| Thermometer code | | | | | | | Binary code | | | Decimal |
|---|---|---|---|---|---|---|---|---|---|---|
| O6 | O5 | O4 | O3 | O2 | O1 | O0 | B2 | B1 | B0 | value |
| N/A | N/A | N/A | 0 | 0 | 0 | 0 | 0 | 0 | 0 | 0 |
| N/A | N/A | N/A | 0 | 0 | 0 | 1 | 0 | 0 | 1 | 1 |
| N/A | N/A | N/A | 0 | 0 | 1 | 1 | 0 | 1 | 0 | 2 |
| N/A | N/A | N/A | 0 | 1 | 1 | 1 | 0 | 1 | 1 | 3 |
| 0 | 0 | 0 | 1 | N/A | N/A | N/A | 1 | 0 | 0 | 4 |
| 0 | 0 | 1 | 1 | N/A | N/A | N/A | 1 | 0 | 1 | 5 |
| 0 | 1 | 1 | 1 | N/A | N/A | N/A | 1 | 1 | 0 | 6 |
| 1 | 1 | 1 | 1 | N/A | N/A | N/A | 1 | 1 | 1 | 7 |

Table 2-1 is a truth table for converting the bits $O_0$~$O_6$ of the thermometer code into the bits $B_0$~$B_2$ of the binary code. According to Table 2-1, the conversion relationship between bits $O_0$~$O_6$ and bits $B_0$~$B_2$ may be obtained, such as Equation (3-1)~Equation (3-3).

$$B_2 = O_3 \tag{3-1}$$

$$B_1 = O_1 \text{ (or, } B_1 = O_5 \text{)} \tag{3-2}$$

$$B_0 = \overline{O_0\ \&\overline{O_1}\ \&O_1\ \&O_2}\left(\text{or, } B_0 = \overline{O_4\ \&\overline{O_5}\ \&O_6\ \&O_5}\right) \tag{3-3}$$

The inverter 210, NAND gate 220 and NAND gate 230 of the latch logic circuit 200 perform logical operations to convert the bits $O_0$~$O_6$ of the thermometer code into bits $B_0$~$B_2$ of the binary code. Please refer to Table 2-2 and Table 2-3 for the logic operations of the latch logic circuit 200. Firstly, in the operating period "Cycle 1", the following operations are performed: (1) The bit $O_3$ obtained at time point t3 is stored in the latch DL, and the bit $O_3$ is transferred to the latch CDL. (2) Latch element Q1 stores bit $O_3$ to replace the originally stored logic value "1".

Then, in the operating period "Cycle 2", the following operations are performed: (1) The bit $O_3$ stored in the latch DL is transferred to the latch L3.

Then, in the next operating period "Cycle 3", the following operations are performed: (1) The bit $O_1$ stored in the latch DL and the bit $O_2$ stored in the latch L3 are performed with an "NAND" operation through the NAND gate 220 to obtain $\overline{O_2 \& O_1}$. The operation result $\overline{O_2 \& O_1}$ is stored in the latch L3. (2) The $\overline{O_2 \& O_1}$ stored in latch L3 is transferred to latch CDL. (3) The inverter 210 inverts the bit $O_1$ stored in the latch DL to $\overline{O_1}$ and stores it in the latch L1. (4) The bit $O_1$ stored in the latch DL is transferred to the latch L2.

Then, in the next operating cycle "Cycle 4", the following operations are performed: (1) $O_0$ stored in latch L1 is transferred to latch L3. (2) The $O_0$ stored in the latch L3 and the $\overline{O_1}$ stored in the latch DL are performed with an "NAND" operation by the NAND gate 220 to obtain $O_0 \& \overline{O_1}$, and store it in the latch L3. (3) The $O_0 \& \overline{O_1}$ stored in the latch L3 and the $\overline{O_2 \& O_1}$ stored in the latch CDL are performed with an "NAND" operation by the NAND gate 220 to obtain $\overline{O_0 \& \overline{O_1} \& O_1 \& O_2}$.

TABLE 2-2

| Cycle | DL | L1 | L2 | Q1 | L3 | CDL |
|---|---|---|---|---|---|---|
| 1 | $O_3$ | | | 1 → $O_3$ | | $O_3$ |
| 2 | $O_3$ → $O_2$ | | | $O_3$ | $O_2$ | $O_3$ |
| 3 | $O_2$ → $O_1$ | $\overline{O_2} \to \overline{O_1}$ | $O_1$ | $O_3$ | $O_2 \to \overline{O_1 \& O_2}$ | $\overline{O_1 \& O_2}$ |
| 4 | $O_1$ → $O_0$ | $\overline{O_1}$ | $O_1$ | $O_3$ | $\overline{O_1 \& O_2} \to \overline{O_1} \to \overline{O_0 \& \overline{O_1}}$ $\overline{O_1 \& O_2} \to \overline{O_0 \& \overline{O_1} \& O_1 \& O_2}$ | |

TABLE 2-3

| Cycle | | | | |
|---|---|---|---|---|
| 1 | Q1 = DL | | | |
| 2 | L3 = DL | | | |
| 3 | L3 = (L3)NAND(DL) | CDL = L3 | L1 = INV(DL) | L2 = DL |
| 4 | L3 = L1 | L3 = (L3)NAND(DL) | CDL = (CDL)NAND(L3) | |

Figure 6:
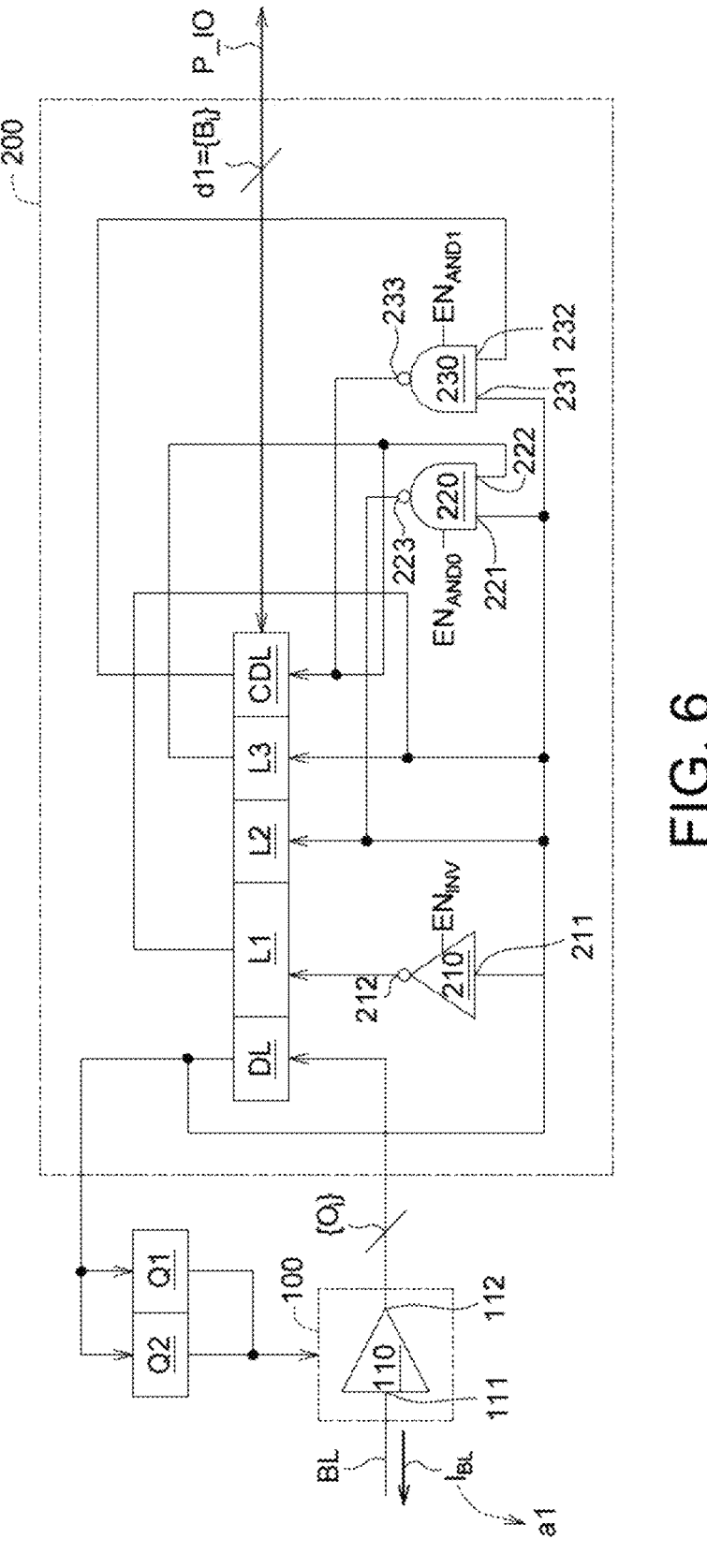
FIG. 6 is a circuit diagram of an analog-to-digital conversion device 1002 according to still another embodiment of the present disclosure.

FIG. 6 is a circuit diagram of an analog-to-digital conversion device 1002 according to still another embodiment of the present disclosure. The analog-to-digital conversion device 1002 of this embodiment is used to perform analog-to-digital conversion of four bits (i.e., the bit width is equal to "four"). The generated digital value d1 may include four bits $B_3$, $B_2$, $B_1$ and $B_0$. Compared with the analog-to-digital conversion device 1001 in FIG. 4, the analog-to-digital conversion device 1002 of this embodiment further includes another latch element Q2. The latch elements Q2 and Q1 are both coupled to the latch DL of the latch logic circuit 200 and the sensing circuit 100. The latch elements Q2 and Q1 are used to set the initial charge amount $Q_{SEN}$ of the node SEN of the sensing circuit 100.

Figures 7A, 7B:
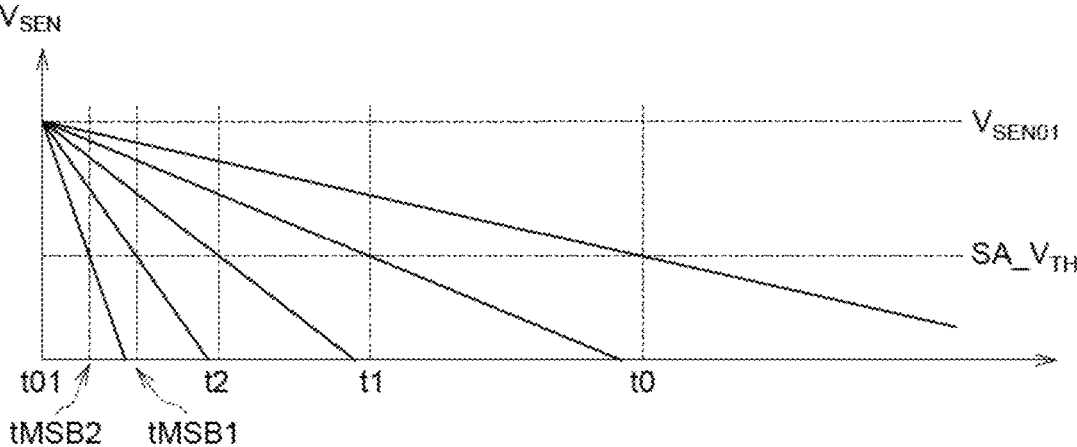
FIG. 7A is a schematic diagram illustrating the change of the voltage $V_{SEN}$ of the node SEN with respect to time t when the analog-to-digital conversion device 1002 of FIG. 6 performs analog-to-digital conversion of four bits.
FIG. 7B illustrates an adjustment method of the initial charge amount $Q_{SEN}$ of the node SEN when the latch logic circuit 200 processes the bits $O_0\sim O_{14}$ to generate the bits $B_0\sim B_3$.

FIG. 7A is a schematic diagram illustrating the change of the voltage $V_{SEN}$ of the node SEN with respect to time t when the analog-to-digital conversion device 1002 of FIG. 6 performs analog-to-digital conversion of four bits. Please refer to both FIGS. 6 and 7A, the sensing circuit 100 of this embodiment sets five time points tMSB2, tMSB1, t2, t1 and t0 to perform sequential input quantization. The initial charge amount $Q_{SEN}$ of the node SEN is set as an equivalent charge amount 2.5 Q by the latch elements Q2 and Q1. According to the mechanism of SAR, the analog-to-digital conversion device 1002 generates the bit $B_3$ of the MSB at time point tMSB2. Then, it is selectively adjusted as equivalent charge amounts of 3.5 Q or 1.5 Q, and the bit $B_2$ of the MSB is generated at time point tMSB1 according to the mechanism of SAR. Then, the initial charge amount $Q_{SEN}$ of the node SEN is set as an equivalent charge amount Q through the latch elements Q1 and Q2. Then, it is selectively adjusted as equivalent charge amounts of 2 Q, 3 Q or 4 Q. According to the mechanism of TDC, the analog-to-digital conversion device 1002 generates the two bits $B_1$ and $B_0$ of the LSB at time points t2, t1 and t0 respectively. Table 3-1 is a truth table for the bits $O_0 \sim O_{14}$ of the thermometer code to convert into the bits $B_0 \sim B_3$ of the binary code.

TABLE 3-1

| Thermometer code | | | | | | | | | |
|---|---|---|---|---|---|---|---|---|---|
| $O_{14}$ | $O_{13}$ | $O_{12}$ | $O_{11}$ | $O_{10}$ | $O_9$ | $O_8$ | $O_7$ | $O_6$ | $O_5$ |
| N/A | N/A | N/A | N/A | N/A | N/A | N/A | 0 | N/A | N/A |
| N/A | N/A | N/A | N/A | N/A | N/A | N/A | 0 | N/A | N/A |

TABLE 3-1-continued

| $O_{14}$ | $O_{13}$ | $O_{12}$ | $O_{11}$ | $O_{10}$ | $O_9$ | $O_8$ | $O_7$ | $O_6$ | $O_5$ |
|---|---|---|---|---|---|---|---|---|---|
| N/A | N/A | N/A | N/A | N/A | N/A | N/A | 0 | N/A | N/A |
| N/A | N/A | N/A | N/A | N/A | N/A | N/A | 0 | N/A | N/A |
| N/A | N/A | N/A | N/A | N/A | N/A | N/A | 0 | 0 | 0 |
| N/A | N/A | N/A | N/A | N/A | N/A | N/A | 0 | 0 | 0 |
| N/A | N/A | N/A | N/A | N/A | N/A | N/A | 0 | 0 | 1 |
| N/A | N/A | N/A | N/A | N/A | N/A | N/A | 0 | 1 | 1 |
| N/A | N/A | N/A | 0 | 0 | 0 | 0 | 1 | N/A | N/A |
| N/A | N/A | N/A | 0 | 0 | 0 | 1 | 1 | N/A | N/A |
| N/A | N/A | N/A | 0 | 0 | 1 | 1 | 1 | N/A | N/A |
| N/A | N/A | N/A | 0 | 1 | 1 | 1 | 1 | N/A | N/A |
| 0 | 0 | 0 | 1 | N/A | N/A | N/A | 1 | N/A | N/A |
| 0 | 0 | 1 | 1 | N/A | N/A | N/A | 1 | N/A | N/A |
| 0 | 1 | 1 | 1 | N/A | N/A | N/A | 1 | N/A | N/A |
| 1 | 1 | 1 | 1 | N/A | N/A | N/A | 1 | N/A | N/A |

| Thermometer code | | | | | Binary code | | | | Decimal |
|---|---|---|---|---|---|---|---|---|---|
| $O_4$ | $O_3$ | $O_2$ | $O_1$ | $O_0$ | $B_3$ | $B_2$ | $B_1$ | $B_0$ | value |
| N/A | 0 | 0 | 0 | 0 | 0 | 0 | 0 | 0 | 0 |
| N/A | 0 | 0 | 0 | 1 | 0 | 0 | 0 | 1 | 1 |
| N/A | 0 | 0 | 1 | 1 | 0 | 0 | 1 | 0 | 2 |
| N/A | 0 | 1 | 1 | 1 | 0 | 0 | 1 | 1 | 3 |
| 0 | 1 | N/A | N/A | N/A | 0 | 1 | 0 | 0 | 4 |
| 1 | 1 | N/A | N/A | N/A | 0 | 1 | 0 | 1 | 5 |
| 1 | 1 | N/A | N/A | N/A | 0 | 1 | 1 | 0 | 6 |
| 1 | 1 | N/A | N/A | N/A | 0 | 1 | 1 | 1 | 7 |
| N/A | N/A | N/A | N/A | N/A | 1 | 0 | 0 | 0 | 8 |
| N/A | N/A | N/A | N/A | N/A | 1 | 0 | 0 | 1 | 9 |
| N/A | N/A | N/A | N/A | N/A | 1 | 0 | 1 | 0 | 10 |
| N/A | N/A | N/A | N/A | N/A | 1 | 0 | 1 | 1 | 11 |
| N/A | N/A | N/A | N/A | N/A | 1 | 1 | 0 | 0 | 12 |
| N/A | N/A | N/A | N/A | N/A | 1 | 1 | 0 | 1 | 13 |
| N/A | N/A | N/A | N/A | N/A | 1 | 1 | 1 | 0 | 14 |
| N/A | N/A | N/A | N/A | N/A | 1 | 1 | 1 | 1 | 15 |

The inverter 210, NAND gate 220 and NAND gate 230 of the latch logic circuit 200 perform logical operations to convert the bits $O_0 \sim O_{14}$ of the thermometer code into the bits $B_0 \sim B_3$ of the binary code, as shown in Table 3-2.

TABLE 3-2

| Cycle | | | | |
|---|---|---|---|---|
| MSB1 | Q2 = (Q2)NAND(DL) | Q1 = (Q1)NAND(DL) | | |
| MSB2 | Q1 = (Q1) NAND(DL) | | | |
| LSB1 | L3 = DL | | | |
| LSB2 | L3 = (L3) NAND(DL) | CDL = L3 | L1 = INV(DL) | L2 = DL |
| LSB3 | L3 = DL | L3 = (L3) NAND (DL) | CDL = (CDL)NAND(L3) | |

Moreover, FIG. 7B illustrates an adjustment method of the initial charge amount $Q_{SEN}$ of the node SEN when the latch logic circuit 200 processes the bits $O_0 \sim O_{14}$ to generate the bits $B_0 \sim B_3$. Referring to both Table 3-2 and FIG. 7B, firstly, performing the following operations in the operating period "Cycle MSB1": (1) Pre-setting the initial charge amount $Q_{SEN}$ of the node SEN as an equivalent charge amount 2.5 Q. (2) The storage data of the latch DL and the storage data of the latch element Q2 are performed with a "NAND" operation, and the operation result is stored in the latch element Q2. (3) The storage data of the latch DL and the storage data of the latch element Q1 are performed with a "NAND" operation, and the operation result is stored in the latch element Q1.

If the latch element Q2 stores a logic value "1", an "NAND" operation are performed on the storage data in the latch DL and the storage data in the latch element Q1 in the subsequent operating period "Cycle MSB2", and the operation result is stored in latch element Q1. Accordingly, the initial charge amount $Q_{SEN}$ of the node SEN is set as an equivalent charge amount 3.5 Q. On the other hand, if the latch element Q2 stores a logic value "0", the initial charge amount $Q_{SEN}$ of the node SEN is set as an equivalent charge amount 1.5 Q in the subsequent operating period "Cycle MSB2".

Then, in the subsequent operating period "Cycle LSB1", the storage data of the latch DL is transferred to the latch L3. If the current initial charge amount $Q_{SEN}$ is the equivalent charge amount 3.5 Q, and the latch element Q1 stores a logic value "1", the initial charge amount $Q_{SEN}$ is set as the equivalent charge amount 4 Q. If the latch element Q1 stores a logic value "0", the initial charge amount $Q_{SEN}$ is set as the equivalent charge amount 3 Q. On the other hand, if the current initial charge amount $Q_{SEN}$ is the equivalent charge amount 1.5 Q, and the latch element Q1 stores a logic value "1", the initial charge amount $Q_{SEN}$ is set as the equivalent charge amount 2 Q. If the latch element Q1 stores a logic value "0", the initial charge amount $Q_{SEN}$ is set as the equivalent charge amount 1 Q.

Then, the current initial charge amount $Q_{SEN}$ remains unchanged in the subsequent operating period "Cycle LSB2". For example, if the current initial charge amount $Q_{SEN}$ is the equivalent charge amount 4 Q, it is maintained as the equivalent charge amount 4 Q. If the current initial charge amount $Q_{SEN}$ is the equivalent charge amount 3 Q, it is maintained as the equivalent charge amount 3 Q, etc. More specifically, the following operations are performed in the operating period "Cycle LSB2": (1) The bit $O_1$ obtained at time point t1 is stored in the latch DL. (2) The bit $O_1$ stored in the latch DL and the bit $O_2$ stored in the latch L3 are performed with a "NAND" operation by the NAND gate 220, and the operation result is stored in the latch L3. (3) The inverter 210 inverts the bit $O_1$ stored in the latch DL to $\overline{O_1}$ and stores it in the latch L1. (4) The bit $O_1$ stored in the latch DL is transferred to the latch L2. (5) The storage data of latch L3 is transferred to latch CDL.

Then, the current initial charge amount $Q_{SEN}$ remains unchanged in the subsequent operating period "Cycle LSB3". The following operations are performed: (1) The bit $O_1$ stored in the latch DL is transferred to the latch L3. (2) The bit $O_0$ obtained at time point t1 is stored in the latch DL. (3) The bit $O_0$ stored in the latch DL and the bit 01 stored in the latch L3 are performed with a "NAND" operation by the NAND gate 220, and the operation result is stored in the latch L3. (4) The storage data of the latch CDL and the storage data of the latch L3 are performed with a "NAND" operation by the NAND gate 230, and the operation result is stored in the latch CDL.

Figure 7C:
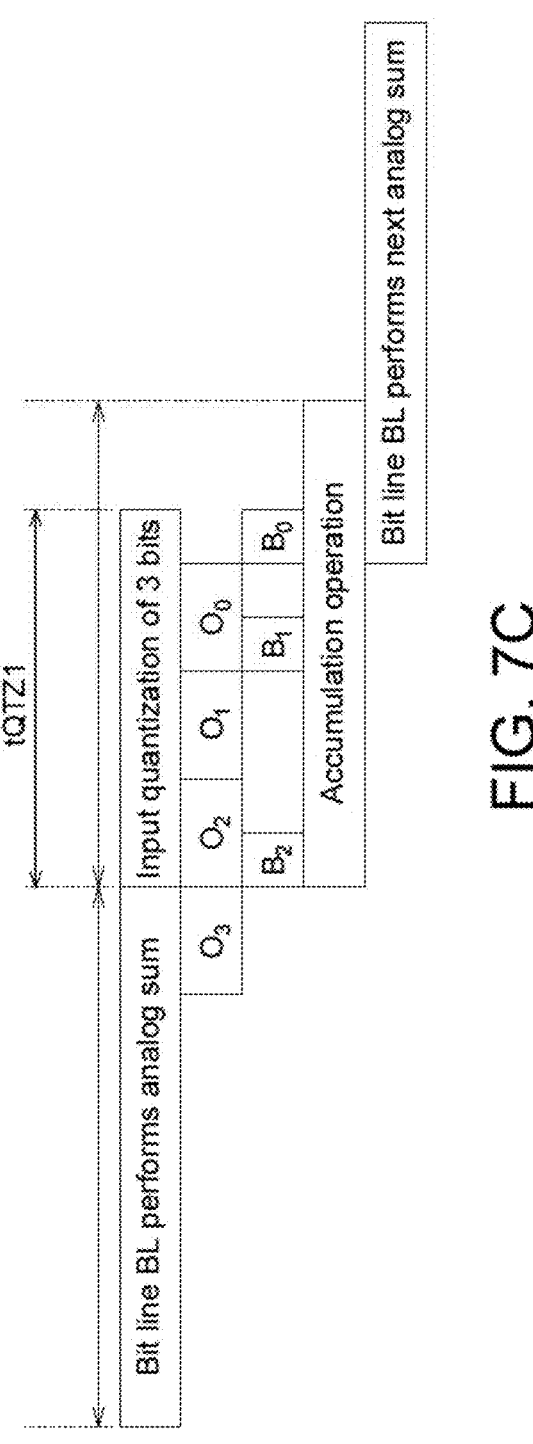
FIG. 7C is a schematic diagram illustrating the time consumption of performing input quantization at three time points according to the embodiment of FIG. 7A.

FIG. 7C is a schematic diagram illustrating the time consumption of performing input quantization at three time points according to the embodiment of FIG. 7A. After the bit line BL performs an analog summing operation (denoted as "analog sum" in FIG. 7A), the latch logic circuit 200 then generates the bit $B_2$, and concurrently the sensing circuit 100 performs input quantization at time point t2 to generate the bit $O_2$. Then, input quantization is performed at time point t1 to generate bit $O_1$. After the input quantization of bit $O_1$ is completed, the latch logic circuit 200 then generates bit $B_1$, and the sensing circuit 100 performs input quantization at time point t0 to generate bit $O_0$. After the input quantization of bit $O_0$ is completed, the latch logic circuit 200 then generates bit $B_0$, and concurrently the bit line BL performs the next analog summing operation (denoted as "next analog sum" in FIG. 7A). In this embodiment, the input quantization(s) of three bits $O_2$, $O_1$, and $O_0$ are performed at three time points, and three times of "BL toggling" have to be performed. The input quantization(s) of three bits $O_2$, $O_1$ and $O_0$ may consume a processing time tQTZ1.

Figures 8A, 8B:
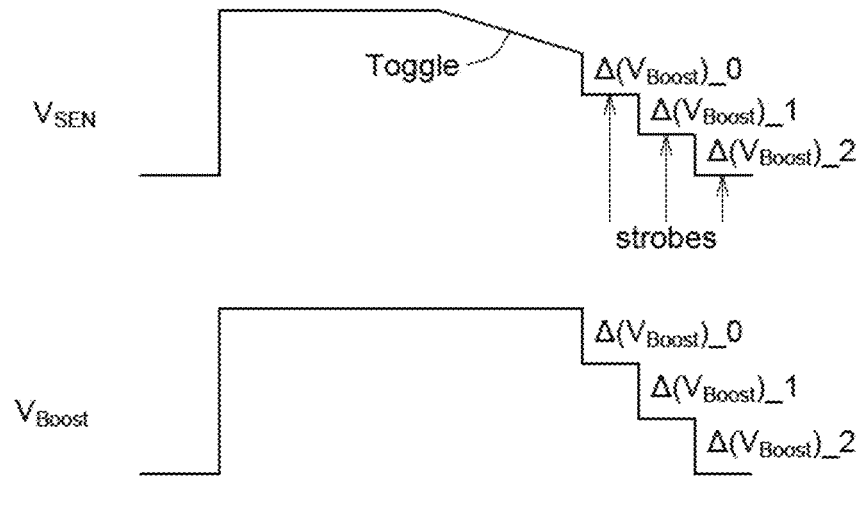
FIG. 8A is a schematic diagram illustrating the changes of the voltage $V_{SEN}$ of the node SEN and the voltage $V_{Boost}$ of the node Boost when the analog-to-digital conversion device 1002 of FIG. 6 utilizes a faster input quantization mechanism.
FIG. 8B is a schematic diagram illustrating the change of the voltage $V_{SEN}$ of the node SEN with respect to time t when the analog-to-digital conversion device 1002 of FIG. 6 utilizes the faster input quantization mechanism.

The analog-to-digital conversion device 1002 may also utilize a faster input quantization mechanism when performing analog-to-digital conversion of four bits. FIG. 8A is a schematic diagram illustrating the changes of the voltage $V_{SEN}$ of the node SEN and the voltage $V_{Boost}$ of the node Boost when the analog-to-digital conversion device 1002 of FIG. 6 utilizes a faster input quantization mechanism. As shown in FIG. 8A, the voltage $V_{Boost}$ of node Boost gradually decreases in steps. The steps of decreasing are: voltage difference $\Delta(V_{Boost})\_0$, voltage difference $\Delta(V_{Boost})\_1$ and voltage difference $\Delta(V_{Boost})\_2$, which may be referred to as "step-voltage-difference". Concurrently, the voltage $V_{SEN}$ of the node SEN also gradually decreases according to the above-mentioned voltage difference $\Delta(V_{Boost})\_0$, voltage difference $\Delta(V_{Boost})\_1$ and voltage difference $\Delta(V_{Boost})\_2$.

FIG. 8B is a schematic diagram illustrating the change of the voltage $V_{SEN}$ of the node SEN with respect to time t when the analog-to-digital conversion device 1002 of FIG. 6 utilizes the faster input quantization mechanism. Compared with the embodiment in FIG. 7A which generates the two bits $B_1$ and $B_0$ of the LSB at time points t2, t1 and t0 respectively, the embodiment in FIG. 8B executes the input quantization mechanism at a single time point t0 to generate the two bits $B_1$ and $B_0$ of the LSB, which may reduce the time required for input quantization. At time point t0, input quantization is performed based on the three voltage differences $\Delta(V_{Boost})\_0$, A $(V_{Boost})\_1$ and $\Delta(V_{Boost})\_2$ of the node Boost shown in FIG. 8B.

At time point t0, the sensing circuit 100 determines whether a difference value between the voltage $V_{SEN}$ of the node SEN and the voltage difference $\Delta(V_{Boost})\_0$ for the node Boost is greater than the threshold voltage $SA\_V_{TH}$ of the sensing amplifier 110. When the difference value between the voltage $V_{SEN}$ and the voltage difference $\Delta(V_{Boost})\_0$ is greater than the threshold voltage $SA\_V_{TH}$ (as shown in equation (4-1)), the bit $O_0$ generated by the sensing circuit 100 is a logic value "0".

$$V_{SEN} - \Delta(V_{Boost})\_0 > SA\_V_{TH} \qquad (4\text{--}1)$$

On the other hand, when the difference value between the voltage $V_{SEN}$ and the voltage difference $\Delta(V_{Boost})\_0$ is less than the threshold voltage $SA\_V_{TH}$ (as shown in equation (4-2)), the bit $O_0$ generated by the sensing circuit 100 is a logic value "1".

$$V_{SEN} - \Delta(V_{Boost})\_0 < SA\_V_{TH} \qquad (4\text{--}2)$$

Similarly, at time point t0, when the difference value between the voltage $V_{SEN}$ and the voltage difference $\Delta(V_{Boost})\_1$ is greater than or less than the threshold voltage $SA\_V_{TH}$, the bit $O_1$ generated by the sensing circuit 100 is a logic value "0" or a logic value "1". At time point t0, when the difference value between the voltage $V_{SEN}$ and the voltage difference $\Delta(V_{Boost})\_2$ is greater than or less than the threshold voltage $SA\_V_{TH}$, the bit $O_2$ generated by the sensing circuit 100 is a logic value "0" or a logic value "1".

Furthermore, the bits $B_2$ and $B_3$ of the MSB are generated utilizing the mechanism of SAR. When bit $B_2$ is a logic value "0", the initial charge amount $Q_{SEN}$ of the node SEN is set as the equivalent charge amount Q by the latch elements Q2 and Q1. When bit $B_2$ is a logic value "1", the initial charge amount $Q_{SEN}$ is set as the equivalent charge amount 2 Q.

Figure 8C:
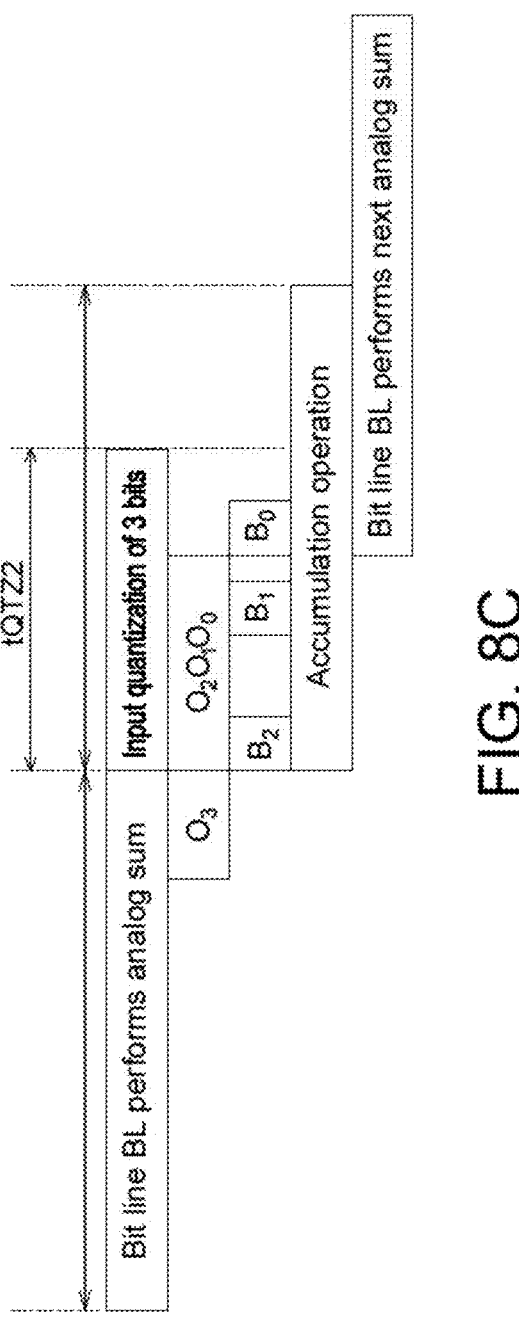
FIG. 8C is a schematic diagram illustrating the time consumption of performing input quantization at a single time point according to the embodiment of FIG. 8B.

FIG. 8C is a schematic diagram illustrating the time consumption of performing input quantization at a single time point according to the embodiment of FIG. 8B. Compared with the embodiment of FIG. 7C, the input quantization of the three bits $O_2$, $O_1$, and $O_0$ in this embodiment may be performed at the same time point, hence the processing time tQTZ2 for the input quantization of the three bits $O_2$, $O_1$, and $O_0$ may be reduced. Such as, the processing time tQTZ2 for the input quantization in the example of FIG. 8C is less than the processing time tQTZ1 for the input quantization in the example of FIG. 7C. Furthermore, the processing time for the input quantization of the three bits $O_2$, $O_1$, and $O_0$ may be overlapped with the processing time for the latch logic circuit 200 to generate the bit $B_1$. During the process of the input quantization of the three bits $O_2$, $O_1$, and $O_0$ in this embodiment, in addition to two times of strobe operations performed by the sensing amplifier 110, the sensing circuit 100 only needs to perform one time of "BL toggling", hence operation time may be saved.

Figure 9:
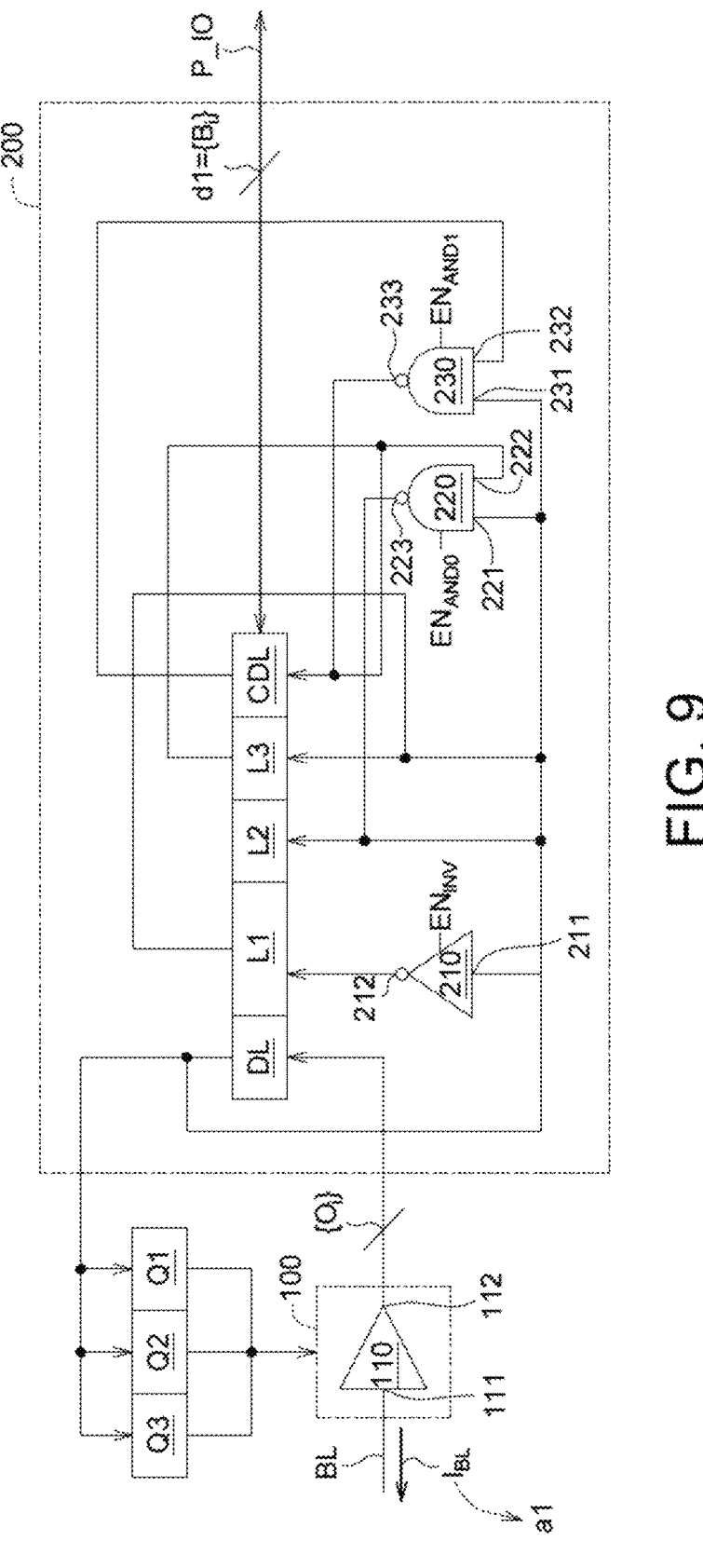
FIG. 9 is a circuit diagram of an analog-to-digital conversion device 1003 according to yet another embodiment of the present disclosure.

FIG. 9 is a circuit diagram of an analog-to-digital conversion device 1003 according to yet another embodiment of the present disclosure. The analog-to-digital conversion device 1003 of this embodiment is used to perform analog-to-digital conversion of five bits (i.e., the bit width is equal to "five"). The generated digital value d1 may include five bits $B_4$, $B_3$, $B_2$, $B_1$ and $B_0$. Compared with the analog-to-digital conversion device 1002 of FIG. 6, the analog-to-digital conversion device 1002 of this embodiment further includes another latch element Q3. The latch elements Q1~Q3 are used to set the initial charge amount $Q_{SEN}$ of the node SEN of the sensing circuit 100.

Figure 10:
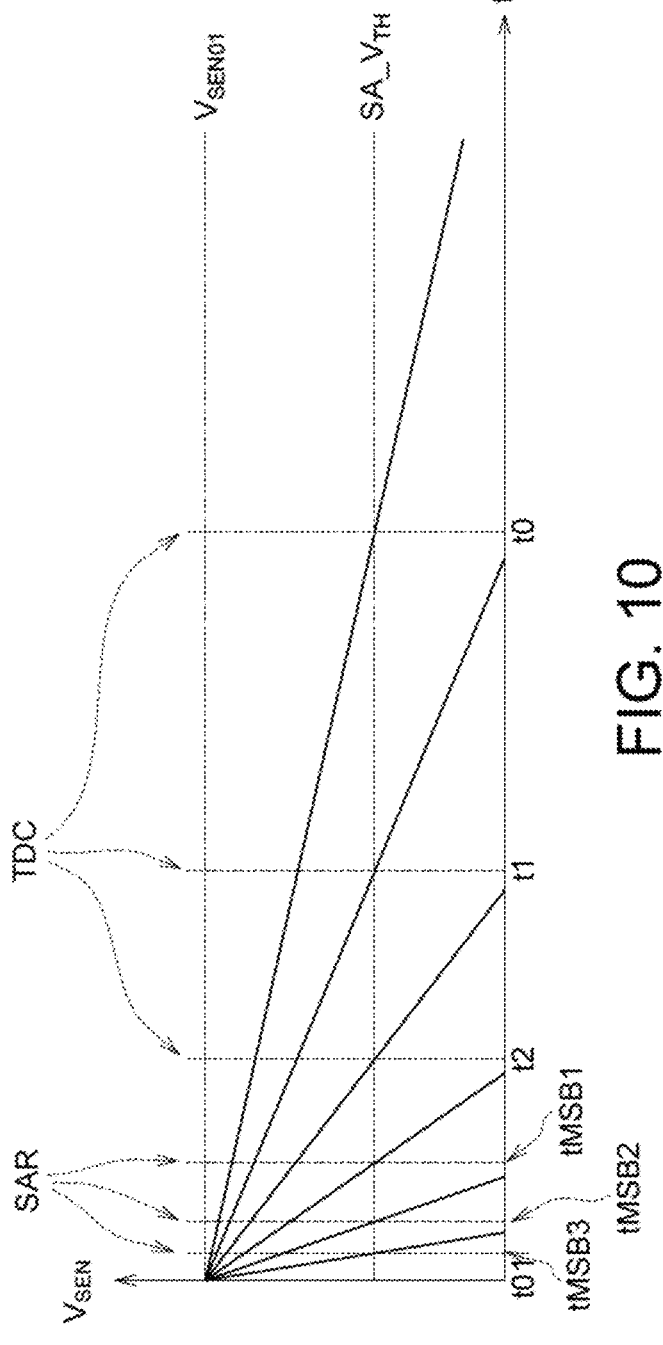
FIG. 10 is a schematic diagram illustrating the change of the voltage $V_{SEN}$ of the node SEN with respect to time t when the analog-to-digital conversion device 1003 of FIG. 9 performs analog-to-digital conversion of five bits.

FIG. 10 is a schematic diagram illustrating the change of the voltage $V_{SEN}$ of the node SEN with respect to time t when the analog-to-digital conversion device 1003 of FIG. 9 performs analog-to-digital conversion of five bits. Compared with the embodiment of FIG. 7A, the sensing circuit 100 of this embodiment further sets a time point tMSB3 for generating the bit $B_4$ of the MSB.

TABLE 4-1

| Cycle | | | | |
|-------|---|---|---|---|
| MSB1 | Q3 = (Q3)NAND(DL) | Q2 = (Q2) NAND(DL) | | |
| MSB2 | Q2 = (Q2)NAND(DL) | Q1 = (Q1) NAND(DL) | | |
| MSB3 | Q1 = (Q1) NAND (DL) | | | |
| LSB1 | L3 = DL | | | |
| LSB2 | L3 = (L3) NAND(DL) | CDL = L3 | L1 = INV(DL) | L2 = DL |
| LSB3 | L3 = DL | L3 = (L3) NAND(DL) | CDL = (CDL)NAND(L3) | |

As shown in Table 4-1, the inverter 210, NAND gate 220 and NAND gate 230 of the latch logic circuit 200 perform logical operations to generate bits $B_0$~$B_4$ of the binary code. The operating manner of the latch logic circuit 200 in this embodiment is similar to the embodiment in Table 3-2. The difference between these two embodiments is that, in Table 4-1, the following operations are performed in the operating period "Cycle MSB1": (1) The initial charge amount $Q_{SEN}$ of the node SEN is pre-set as an equivalent charge amount 4.5 Q. (2) The storage data in the latch DL and the storage data in the latch element Q3 are performed with an "NAND" operation, and the operation result is stored in the latch element Q3. (3) The storage data in the latch DL and the storage data in the latch element Q2 are performed with an "NAND" operation, and the operation result is stored in the latch element Q2.

FIG. 11 illustrates an adjustment method of the initial charge amount $Q_{SEN}$ of the node SEN when the latch logic circuit 200 of this embodiment processes the bits $O_0$~$O_{14}$ to generate the bits $B_0$~$B_3$. Referring to FIG. 11, the initial charge amount $Q_{SEN}$ of the node SEN is pre-set as an equivalent charge amount 4.5 Q.

Then, in the subsequent operating period "Cycle MSB2", if the latch element Q3 stores the logic value "1", the initial charge amount $Q_{SEN}$ is adjusted as an equivalent charge amount 6.5 Q. If the latch element Q3 stores the logic value "0", the initial charge amount $Q_{SEN}$ is adjusted as an equivalent charge amount 2.5 Q.

Then, in the subsequent operating period "Cycle MSB3", if the initial charge amount $Q_{SEN}$ is an equivalent charge amount 6.5 Q, and the latch element Q2 stores the logic value "1", then the initial charge amount $Q_{SEN}$ is adjusted as an equivalent charge amount 7.5 Q. If the latch element Q2 stores the logic value "0", the initial charge amount $Q_{SEN}$ is adjusted as an equivalent charge amount 5.5 Q.

On the other hand, if the initial charge amount $Q_{SEN}$ is an equivalent charge amount 2.5 Q and the latch element Q2 stores a logic value "1", the initial charge amount $Q_{SEN}$ is adjusted as the equivalent charge amount 3.5 Q. If the latch element Q2 stores the logic value "0", the initial charge amount $Q_{SEN}$ is adjusted as an equivalent charge amount 1.5 Q.

Then, in the subsequent operating period "Cycle LSB1", if the initial charge amount $Q_{SEN}$ is an equivalent charge amount 7.5 Q, and the latch element Q1 stores the logic value "1", then the initial charge amount $Q_{SEN}$ is adjusted as an equivalent charge amount 8 Q. If the latch element Q1 stores the logic value "0", the initial charge amount $Q_{SEN}$ is adjusted as an equivalent charge amount 7 Q. Furthermore, if the initial charge amount $Q_{SEN}$ is an equivalent charge amount 5.5 Q and the latch element Q1 stores a logic value "1", it is adjusted as an equivalent charge amount 6 Q. If the latch element Q1 stores a logic value "0", it is adjusted as an equivalent charge amount of 5 Q. In addition, if the initial charge amount $Q_{SEN}$ is an equivalent charge amount 3.5 Q and the latch element Q1 stores a logic value "1", it is adjusted as the equivalent charge amount 4 Q. If the latch element Q1 stores the logic value "0", it is adjusted as the equivalent charge amount 3 Q. Furthermore, if the initial charge amount $Q_{SEN}$ is an equivalent charge amount 1.5 Q and the latch element Q1 stores a logic value "1", it is adjusted as an equivalent charge amount 2 Q. If the latch element Q1 stores the logic value "0", it is adjusted as an equivalent charge amount 1 Q.

In summary, the analog-to-digital conversion devices of various embodiments of the present disclosure may be adapted to the architecture of a standard page buffer of the memory array (especially for the NAND flash memory array), and therefore may achieve high operating bandwidth, and have lower energy consumption.

It will be apparent to those skilled in the art that various modifications and variations may be made to the disclosed embodiments. It is intended that the specification and examples be considered as exemplars only, with a true scope of the disclosure being indicated by the following claims and their equivalents.

What is claimed is:

1. An analog-to-digital conversion device, comprising:
a sensing circuit, coupled to a bit line of a memory array, and used to sense a current in the bit line to generate a bit-sequence, the bit-sequence has a form of a thermometer code to represent an analog value, comprising:
a sensing amplifier, having an input end coupled to the bit line, the input end has a first node, and the first node has a first node voltage,
wherein, the sensing circuit generates the bit-sequence according to the first node voltage and a threshold voltage of the sensing amplifier,
a latch logic circuit, including a plurality of latches and a plurality of logic circuits to form a page buffer of the memory array, and used to generate a bit-set according to the bit-sequence, the bit-set has a form of a binary code to represent a digital value; and
at least one latch element, coupled to the sensing circuit, and used to set an initial charge amount of the first node,
wherein, the latches and the logic circuits perform a conversion process to convert the bit-sequence into the bit-set, and the conversion process has a bit width.

2. The analog-to-digital conversion device according to claim 1, wherein the logic circuits of the latch logic circuit include an inverter and two NAND gates, and the inverter and the NAND gates execute a truth value conversion for the thermometer code and the binary code.

3. The analog-to-digital conversion device according to claim 1, wherein one of the latches of the latch logic circuit is coupled to an output end of the sensing amplifier to receive the bit-sequence, and another one of the latches is coupled to a data input/output path to transmit the bit-set.

4. The analog-to-digital conversion device according to claim 1, wherein when the first node voltage is greater than or less than the threshold voltage, the bit-sequence has a logic value "0" or a logic value "1".

5. The analog-to-digital conversion device according to claim 1, wherein the sensing circuit generates the bit-sequence according to a plurality of sensing time points at which the first node voltage decreases to the threshold voltage.

6. The analog-to-digital conversion device according to claim 5, wherein when the bit width of the conversion process is equal to two, the sensing circuit generates the bit-sequence according to a first time point, a second time point and a third time point of the sensing time points.

7. The analog-to-digital conversion device according to claim 6, wherein the latch logic circuit generates two bits of least significant bits (LSB) of the bit-set by a time-to-digital conversion (TDC) mechanism according to the first time point, the second time point and the third time point.

8. The analog-to-digital conversion device according to claim 5, wherein when the bit width of the conversion process is greater than or equal to three, the sensing circuit generates one bit of the bit-sequence according to at least one fourth time point of the sensing time points.

9. The analog-to-digital conversion device according to claim 8, wherein the latch logic circuit generates at least one bit of most significant bits (MSB) of the bit-set by a successive-approximation register (SAR) mechanism according to the at least one fourth time point.

10. The analog-to-digital conversion device according to claim 1, wherein when the at least one latch element stores a logic value "1" or a logic value "0", the initial charge amount of the first node increases or decreases to an equivalent charge amount.

11. The analog-to-digital conversion device according to claim 1, wherein the number of the at least one latch element is equal to the bit width of the conversion process minus two.

12. The analog-to-digital conversion device according to claim 1, wherein the first node is coupled to a second node through a capacitor, the second node has a second node voltage, and the first node voltage and the second node voltage gradually decreases according to at least one step-voltage-difference.

13. The analog-to-digital conversion device according to claim 12, wherein the sensing circuit generates the bit-sequence according to a difference between the first node voltage and the at least one step-voltage-difference and the threshold voltage.

14. The analog-to-digital conversion device according to claim 13, wherein the sensing circuit generates the bit-sequence according to a sensing time point when the first node voltage decreases to the threshold voltage.

* * * * *